United States Patent
Yoo

(10) Patent No.: US 9,866,970 B2
(45) Date of Patent: Jan. 9, 2018

(54) METHOD OF MANUFACTURING A MICROPHONE

(71) Applicant: HYUNDAI MOTOR COMPANY, Seoul (KR)

(72) Inventor: Ilseon Yoo, Seoul (KR)

(73) Assignee: Hyundai Motor Company, Seoul (KR)

( * ) Notice: Subject to any disclaimer, the term of this patent is extended or adjusted under 35 U.S.C. 154(b) by 0 days.

(21) Appl. No.: 14/853,507

(22) Filed: Sep. 14, 2015

(65) Prior Publication Data
US 2016/0112806 A1  Apr. 21, 2016

(30) Foreign Application Priority Data

Oct. 17, 2014 (KR) .......................... 10-2014-0141165

(51) Int. Cl.
| | | |
|---|---|---|
| *H04R 31/00* | (2006.01) | |
| *H04R 19/00* | (2006.01) | |
| *B81C 1/00* | (2006.01) | |
| *H04R 7/04* | (2006.01) | |
| *H04R 7/16* | (2006.01) | |
| *H04R 7/26* | (2006.01) | |

(52) U.S. Cl.
CPC ....... *H04R 19/005* (2013.01); *B81C 1/00182* (2013.01); *H04R 31/00* (2013.01); *B81B 2201/0257* (2013.01); *H04R 7/04* (2013.01); *H04R 7/16* (2013.01); *H04R 7/26* (2013.01); *H04R 2231/003* (2013.01)

(58) Field of Classification Search
CPC ........ H04R 1/1016; H04R 1/105; H04R 1/04; H04R 19/04; H04R 1/08; H04R 25/407; H04R 25/604; H04R 25/652; H04R 25/658; H04R 31/006; H04R 3/00
See application file for complete search history.

(56) References Cited

U.S. PATENT DOCUMENTS

| | | | | |
|---|---|---|---|---|
| 6,410,390 | B1 * | 6/2002 | Choi | ..................... H01L 27/115 257/E21.682 |
| 2010/0308425 | A1 * | 12/2010 | Laming | ................ H04R 19/005 257/416 |
| 2011/0316100 | A1 * | 12/2011 | Kim | ....................... H04R 19/04 257/416 |

FOREIGN PATENT DOCUMENTS

| | | |
|---|---|---|
| JP | 4355273 B2 | 10/2009 |
| KR | 10-0716637 B1 | 5/2007 |
| KR | 10-0781200 B1 | 11/2007 |

(Continued)

*Primary Examiner* — Paul D Kim
(74) *Attorney, Agent, or Firm* — McDermott Will & Emery LLP

(57) ABSTRACT

A method of manufacturing a microphone includes preparing a substrate and forming an oxide layer pattern on the substrate and an oxide layer on a rear side of the substrate. The vibration membrane is formed over the substrate by injecting conductive ions into the substrate. A sacrificial layer and a fixed electrode are sequentially formed on the substrate and the vibration membrane by removing the oxide layer pattern. A first photoresist layer pattern is formed on the fixed electrode, and an air inlet is formed by patterning the fixed electrode. A second photoresist layer pattern is formed on a rear side of the oxide layer, and a penetration hole, through which a portion of the vibration membrane is exposed, is formed by etching the oxide layer and the rear side of the substrate. An air layer is formed between the fixed electrode and the vibration membrane.

7 Claims, 7 Drawing Sheets

(56) References Cited

FOREIGN PATENT DOCUMENTS

KR  10-2008-0031467 A  4/2008

* cited by examiner

METHOD OF MANUFACTURING A MICROPHONE

CROSS-REFERENCE TO RELATED APPLICATION

This application claims the benefit of priority to Korean Patent Application No. 10-2014-0141165 filed in the Korean Intellectual Property Office on Oct. 17, 2014, the entire content of which is incorporated herein by reference.

TECHNICAL FIELD

The present disclosure relates to a microphone and a method of manufacturing the same.

BACKGROUND

A microphone converts a voice into an electrical signal, and it has becoming smaller. Accordingly, a microphone using micro-electro-mechanical system (MEMS) technology has been developed.

Such a MEMS microphone is more resistant to humidity and heat compared to a conventional electret condenser microphone (ECM), and it may be downsized and integrated with a signal processing circuit.

In general, the MEMS microphone can be classified into a capacitive MEMS microphone and a piezoelectric MEMS microphone.

The capacitive MEMS microphone includes a fixed electrode and a vibration membrane. When an external sound pressure is applied to the vibration membrane, a capacitance value varies because a distance between the fixed electrode and the vibration membrane is changed. The sound pressure is measured based on an electrical signal generated at this time.

The piezoelectric MEMS microphone includes only a vibration membrane. When the vibration membrane deforms by an external sound pressure, an electrical signal is generated due to a piezoelectric effect. The sound pressure is measured based on the electrical signal.

In general, in a case of the capacitive MEMS microphone, a fixed electrode and a vibration membrane are formed using surface micromachining and bulk micromachining. Since the process is complicated and the number of processes increases, it is difficult to manufacture the MEMS microphone. The above information disclosed in this Background section is only for enhancement of understanding of the background of the invention, and therefore, it may contain information that does not form the prior art that is already known in this country to a person of ordinary skill in the art.

SUMMARY

The present disclosure has been made in an effort to provide a microphone and a method of manufacturing the same having advantages of reducing the number of manufacturing processes when an input microphone is manufactured.

According to an exemplary embodiment of the present inventive concept, a method of manufacturing a microphone includes preparing a substrate and forming an oxide layer pattern on the substrate and an oxide layer on a rear side of the substrate. The vibration membrane is formed on the substrate by injecting conductive ions into the substrate using the oxide layer pattern as a mask. A sacrificial layer and a fixed electrode are sequentially formed on the substrate and the vibration membrane by removing the oxide layer pattern. A first photoresist layer pattern is formed on the fixed electrode, and an air inlet is formed by patterning the fixed electrode using the first photoresist layer pattern as a mask. A second photoresist layer pattern is formed on a rear side of the oxide layer, and a penetration hole, through which a portion of the vibration membrane is exposed, is formed by etching the oxide layer and the rear side of the substrate. An air layer is formed between the fixed electrode and the vibration membrane by removing a portion of the sacrificial layer.

The step of forming the penetration hole may include forming a plurality of slots in the vibration membrane.

The slots may be formed over the penetration hole.

The ions may include boron ions or phosphorous ions.

The method may further include forming a first pad connected to the fixed electrode and a second pad connected to the vibration membrane after the forming of the penetration hole.

The forming of the first pad and the second pad may include forming a photoresist layer through which a portion of the fixed electrode and the portion of the vibration membrane are exposed on the fixed electrode and the vibration membrane. A metal layer is formed on the photoresist layer at the portion of the fixed electrode and at the portion of the vibration membrane. The photoresist layer and the metal layer formed on the photoresist layer are removed.

The fixed electrode may be made of polysilicon or a metal.

The substrate may include silicon.

According to another exemplary embodiment of the present inventive concept, a microphone includes a substrate having a penetration hole. A vibration membrane is disposed over the substrate and covers the penetration hole. A fixed electrode, which is disposed over the vibration membrane and spaced apart from the vibration membrane, includes a plurality of air inlets. the vibration membrane is made of silicon into which conductive ions are injected.

The vibration membrane may include a plurality of slots.

The microphone may further include a support layer disposed at an edge of the vibration membrane and supporting the fixed electrode.

As described above, in accordance with the exemplary embodiment of the present invention, since the microphone is manufactured using four masks, the number of processes can be reduced, and accordingly a process cost can be reduced.

DETAILED DESCRIPTION OF THE EMBODIMENTS

Figure 1:
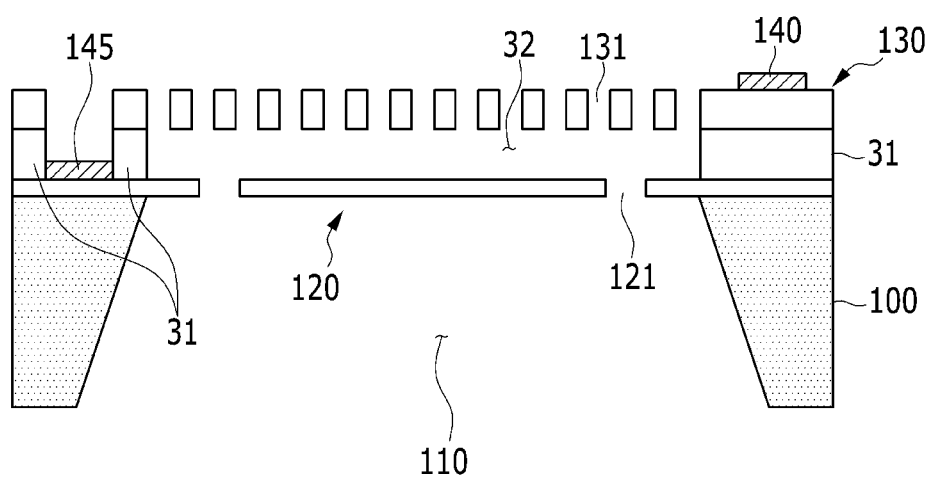
FIG. 1 is a schematic cross-sectional view of a microphone in accordance with an exemplary embodiment of the present inventive concept.

Hereinafter, some exemplary embodiments of the present inventive concept are described in detail with reference to the accompanying drawing. However, the present disclosure is not limited to the embodiments described herein, but may be materialized in other forms. On the contrary, the introduced embodiments are provided to make disclosed contents thorough and complete and to sufficiently deliver the spirit of the present inventive concept to those skilled in the art.

In the drawings, the thickness of layers and areas has been enlarged for clarity of a description. Furthermore, when it is said that a layer is "on" another layer or substrate, the layer may be directly formed on the other layer or substrate or a third layer may be interposed therebetween.

Hereinafter, a microphone in accordance with an exemplary embodiment of the present inventive concept is described with reference to FIGS. 1 and 2.

Figure 2:
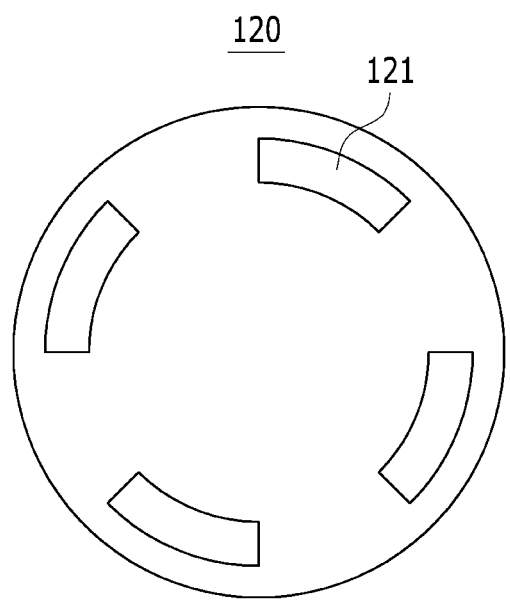
FIG. 2 is a top plan view schematically illustrating the vibration membrane of the microphone of FIG. 1.

FIG. 1 is a schematic cross-sectional view of a microphone in accordance with an exemplary embodiment of the present inventive concept, and FIG. 2 is a top plan view schematically illustrating the vibration membrane of the microphone of FIG. 1.

Referring to FIG. 1, the microphone according to the present disclosure includes a substrate 100, a vibration membrane 120, and a fixed electrode 130.

The substrate 100 may be made of silicon and has a penetration hole 110 formed therein.

The vibration membrane 120 is disposed on the substrate 100. The vibration membrane 120 covers the penetration hole 110. A portion of the vibration membrane 120 is exposed to the penetration hole 110, and is vibrated in response to an external sound.

The vibration membrane 120 has a circle shape and includes a plurality of slots 121 which are formed over the penetration hole 110. In the present disclosure, the vibration membrane 120 is illustrated as having four slots 121, but it is not limited thereto, and the number of slots 121 may be more than four. The slots 121 may have the same size or different sizes.

The vibration membrane 120 may be made of silicon into which conductive ions are injected. In this case, the ions may include boron ions or phosphorous ions.

The fixed electrode 130 spaced apart from the vibration membrane 120 is disposed on the vibration membrane 120. The fixed electrode 130 includes a plurality of air inlets 131.

The fixed electrode 130 is disposed on a support layer 31 and fixed thereto. The support layer 31 is disposed at an edge portion of the vibration membrane 120, and supports the fixed electrode 130. Here, the fixed electrode 130 may be made of polysilicon or a metal.

An air layer 32 is formed between the fixed electrode 130 and the vibration membrane 120, and the fixed electrode 130 and the vibration membrane 120 are spaced apart from each other at a predetermined interval.

An external sound is introduced through the air inlets 141 formed in the fixed electrode 130, thus stimulating the vibration membrane 120, and the vibration membrane 120 is vibrated in response thereto.

When the vibration membrane 120 vibrates in response to the external sound, the distance between the vibration membrane 120 and the fixed electrode 130 is changed. Accordingly, capacitance between the vibration membrane 120 and the fixed electrode 130 is changed. A signal processing circuit (not shown) converts the changed capacitance into an electrical signal through a first pad 140 connected to the fixed electrode 130 and a second pad 145 connected to the vibration membrane 120, thereby detecting the external sound.

A method of manufacturing the microphone in accordance with an exemplary embodiment of the present inventive concept is described below with reference to FIGS. 1 and 3 to 7.

FIGS. 3 to 7 are diagrams illustrating a method of manufacturing the microphone in accordance with an exemplary embodiment of the present inventive concept.

Figure 3:
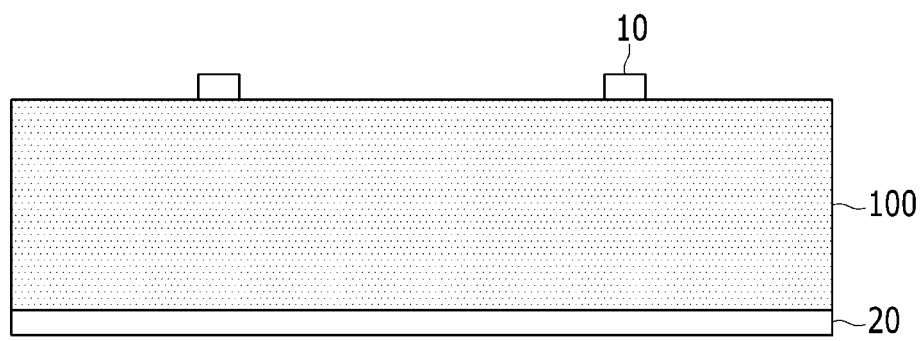
FIGS. 3 to 7 are diagrams illustrating a method of manufacturing the microphone in accordance with an exemplary embodiment of the present inventive concept.

Referring to FIG. 3, after the substrate 100 is prepared, an oxide layer pattern 10 is formed on the substrate 100 and an oxide layer 20 is formed on a rear of the substrate 100. The oxide layer pattern 10 exposes a portion of the substrate 100. Here, the substrate 100 may be made of silicon.

Figure 4:
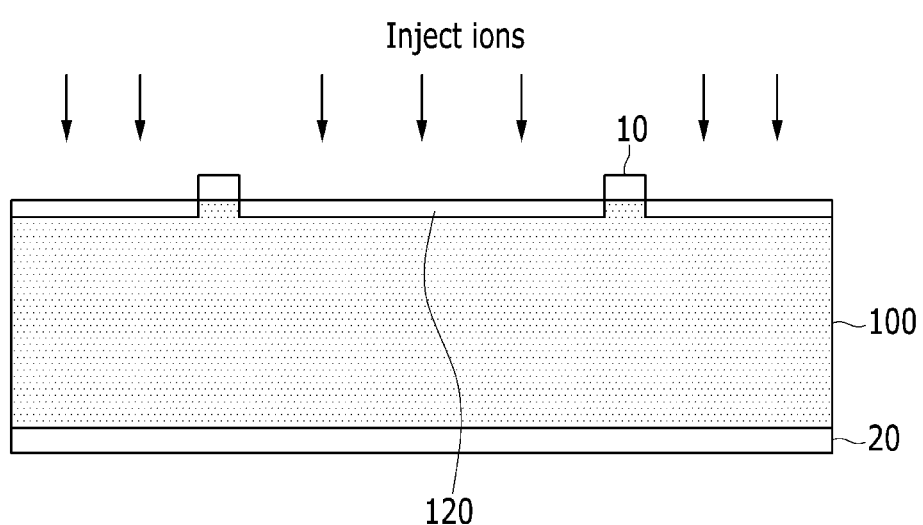

Referring FIG. 4, the vibration membrane 120 is formed by injecting conductive ions into the exposed substrate 100 using the oxide layer pattern 10 as a mask. Accordingly, the vibration membrane 120 includes silicon in which conductive ions are injected. In this case, the ions may include boron ions or phosphorous ions.

Figure 5:
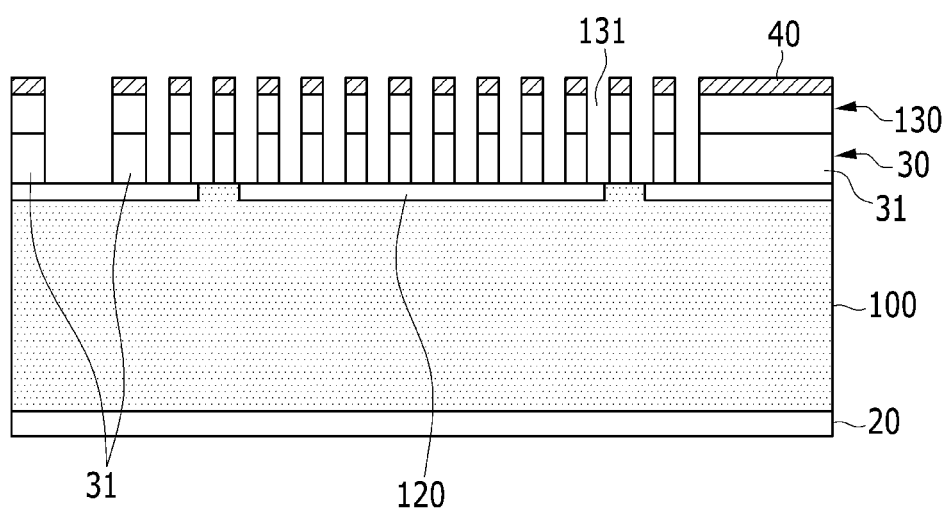

Referring to FIG. 5, after the oxide layer pattern 10 is removed, a sacrificial layer 30 and a fixed electrode 130 are sequentially formed on the substrate 100 and the vibration membrane 120, and a first photoresist layer pattern 40 is formed on the fixed electrode 130.

Next, a plurality of air inlets 131 are formed by patterning the fixed electrode 130 using the first photoresist pattern 40 as a mask. In this case, a support layer 31 is formed at an edge of the vibration layer 120 by also patterning the sacrificial layer 30.

Here, the sacrificial layer 30 may be made of photoresist materials, a silicon oxide, or a silicon nitride, and the fixed electrode 130 may be made of polysilicon or a metal.

Figure 6:
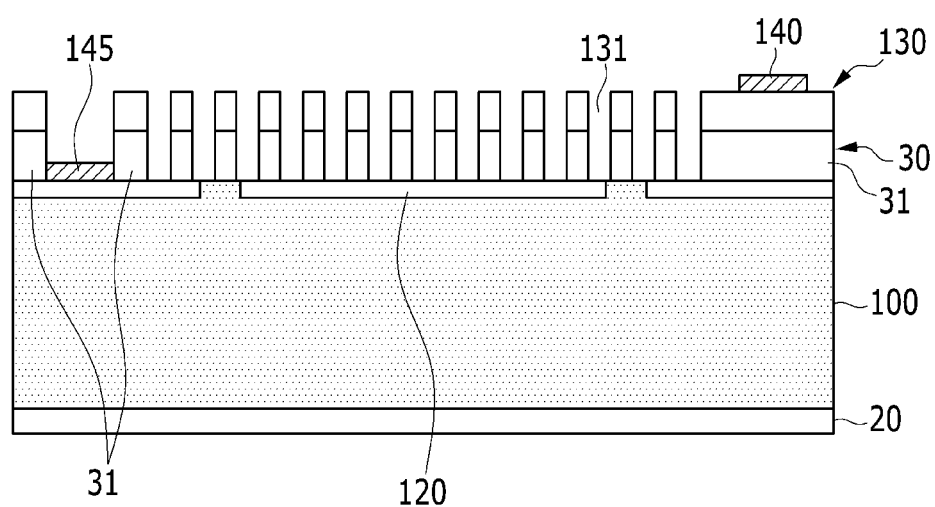

Referring to FIG. 6, after removing the first photoresist layer pattern 40, a first pad 140 connected to the fixed electrode 130 and a second pad 145 connected to the vibration membrane 120 are formed. The first pad 140 and the second pad 145 may be lifted off.

The first pad 140 and the second pad 145 may be formed by a lift-off scheme as follows.

A photoresist layer is formed on the fixed electrode 130 and the vibration membrane 120. The photoresist layer exposes a formation region of the first pad 140, that is, a portion of the fixed electrode 130, and a formation region of the second pad 145, that is, the portion of the vibration membrane 120.

Next, after a metal layer is formed on the portion of the fixed electrode 130 exposed by the photoresist layer, the portion of the vibration membrane 120, and the photoresist layer, the photoresist layer is removed. In this case, when the photoresist layer is removed, the metal layer on the photoresist layer is removed, and metal layers formed on the portion of the fixed electrode 130 and the portion of the vibration membrane serve as the first pad 140 and the second 145, respectively.

Figure 7:
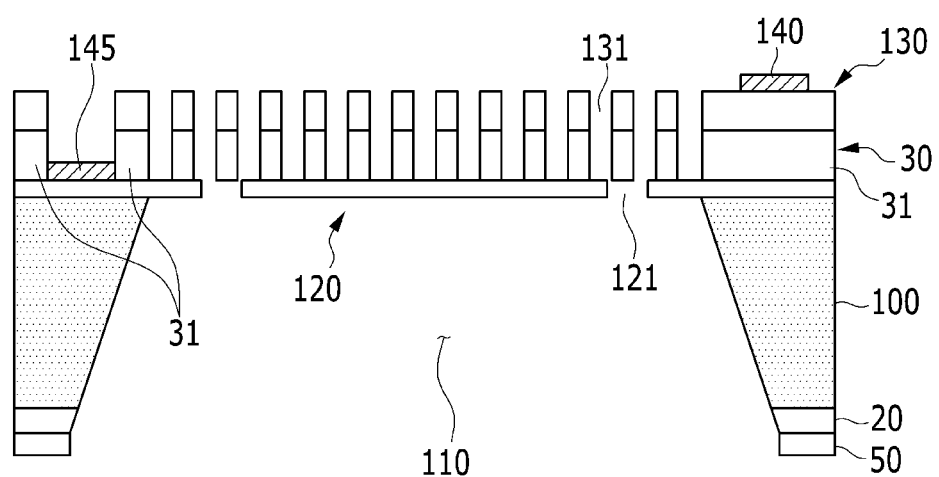

Referring FIG. 7, the penetration hole 110 is formed in the substrate 100.

The penetration hole 110 is formed by performing dry etching or wet etching on rears of the oxide layer 20 and the substrate 100 using a second photoresist layer pattern 50 after forming the second photoresist layer pattern 50 on the rear of the oxide layer 20. In this case, a plurality of slots 121 are formed in the vibration membrane 120, such that a portion of the vibration layer 120 is exposed. The plurality of slots 121 are formed over the penetration hole 110.

Referring to FIG. 1, an air layer 32 is formed by removing a portion of the sacrificial layer 30. Further, the second photoresist layer pattern 50 and the oxide layer 20, which is not etched, are removed.

The air layer 32 may be formed by removing the portion of the sacrificial layer 30 by a wet method using an etchant through the air inlets 131. Furthermore, the air layer 32 may be formed using a dry method such as ashing according to oxygen plasma, through the air inlets 131. The portion of the sacrificial layer 30 is removed through the wet or dry method, and thus the air layer 32 is formed between the fixed electrode 130 and the vibration membrane 120.

In this case, the support layer 31 that supports the fixed electrode 130 is not removed.

As described above, in the method of manufacturing the microphone in accordance with the present disclosure, when the oxide layer pattern 10, the first photoresist pattern 40, the first pad 140, the second pad 145, and the second photoresist pattern 50 are formed, masks are used, respectively. Accordingly, the microphone may be manufactured using four masks.

A general microphone uses about 10 masks. However, in the method of manufacturing the microphone in accordance with the present disclosure, since the microphone may be manufactured using the four masks, the number of processes is reduced so that a process cost is reduced.

While this invention has been described in connection with what is presently considered to be practical exemplary embodiments, it is to be understood that the invention is not limited to the disclosed embodiments, but on the contrary, is intended to cover various modifications and equivalent arrangements included within the spirit and scope of the appended claims.

What is claimed is:

1. A method of manufacturing a microphone, comprising:
   preparing a substrate and forming an oxide layer pattern on the substrate and an oxide layer on a rear side of the substrate;
   forming a vibration membrane on the substrate by injecting conductive ions into the substrate using the oxide layer pattern as a mask;
   sequentially forming a sacrificial layer and a fixed electrode on the substrate and the vibration membrane by removing the oxide layer pattern;
   forming a first photoresist layer pattern on the fixed electrode and forming an air inlet by patterning the fixed electrode using the first photoresist layer pattern as a mask;
   forming a second photoresist layer pattern on a rear side of the oxide layer and forming a penetration hole through which a portion of the vibration membrane is exposed by etching a portion of the oxide layer and a portion of the rear side of the substrate;
   forming an air layer between the fixed electrode and the vibration membrane by removing a portion of the sacrificial layer; and
   forming a first pad connected to the fixed electrode and a second pad connected to the vibration membrane after the air inlet formed.

2. The method of claim 1, wherein the step of forming the penetration hole comprises forming a plurality of slots in the vibration membrane.

3. The method of claim 2, wherein the plurality of slots are formed over the penetration hole.

4. The method of claim 1, wherein the conductive ions comprise boron ions or phosphorous ions.

5. The method of claim 1, wherein the forming of the first pad and the second pad comprises:
   forming a photoresist layer through which a portion of the fixed electrode and the portion of the vibration membrane are exposed on the fixed electrode and the vibration membrane;
   forming a metal layer on the photoresist layer at the portion of the fixed electrode and at the portion of the vibration membrane; and
   removing the photoresist layer and the metal layer formed on the photoresist layer.

6. The method of claim 1, wherein the fixed electrode is made of polysilicon or a metal.

7. The method of claim 1, wherein the substrate comprises silicon.

* * * * *